United States Patent [19]

O'Keefe

[11] 4,150,336
[45] Apr. 17, 1979

[54] AM/FM INTERMEDIATE FREQUENCY GAIN STAGE

[75] Inventor: Gerald T. O'Keefe, San Mateo, Calif.

[73] Assignee: Quadracast Systems, Inc., Palo Alto, Calif.

[21] Appl. No.: 867,608

[22] Filed: Jan. 6, 1978

[51] Int. Cl.² .............................................. H04B 1/16
[52] U.S. Cl. .................................. 325/317; 325/319; 325/408; 325/411; 330/284
[58] Field of Search ............... 325/317, 319, 397, 399, 325/400, 402, 403, 405, 408, 411, 407, 410; 330/144, 145, 284

[56] References Cited

U.S. PATENT DOCUMENTS

| 3,172,040 | 3/1965 | Schultz | 325/317 |
| 3,287,644 | 11/1966 | Poppy | 325/317 |

Primary Examiner—Robert L. Griffin
Assistant Examiner—Alexander M. Gerasimow
Attorney, Agent, or Firm—Robert G. Slick

[57] ABSTRACT

This invention discloses a versatile gain circuit for use as a combination AM and FM intermediate frequency amplifier. The uniqueness of the circuit is large FM gain and large AM dynamic range.

3 Claims, 2 Drawing Figures

AM/FM INTERMEDIATE FREQUENCY GAIN STAGE

SUMMARY OF THE INVENTION

AM and FM radios have different intermediate frequency (I.F.) requirements. For A.M. one requires a perfectly linear moderate gain amplifier and for F.M. one requires a high gain amplifier with hard symmetrical limiting. In systems designed to receive both AM and FM signals, amplification of the I.F. signal has conventionally been performed in one of two ways. One way is to have separate I.F. amplifiers for the FM signal and the AM signal. This approach requires two independent sets of components, thus increasing the size, complexity and cost of the receiver. The second approach is to use one set of components to amplify both the AM and FM signals. This approach usually results in a compromise circuit which cannot be optimized for either the AM or the FM signals individually.

One object of this invention is to provide an AM/FM I.F. amplifier which can be built in integrated circuit form with a minimum number of pin outs. It is desirable to have a relatively simple circuit composed of as few components as possible. Therefore, the circuit disclosed by this invention consists of one set of components capable of amplifying both AM and FM intermediate frequency signals.

The uniqueness of the circuit of the present invention, however, lies primarily in its ability to avoid the traditional compromise found in other I.F. amplifiers. The circuit is capable of perfectly linear AM amplification while simultaneously providing hard symmetrical FM limiting.

DESCRIPTION OF THE PREFERRED EMBODIMENTS

Figure 1:
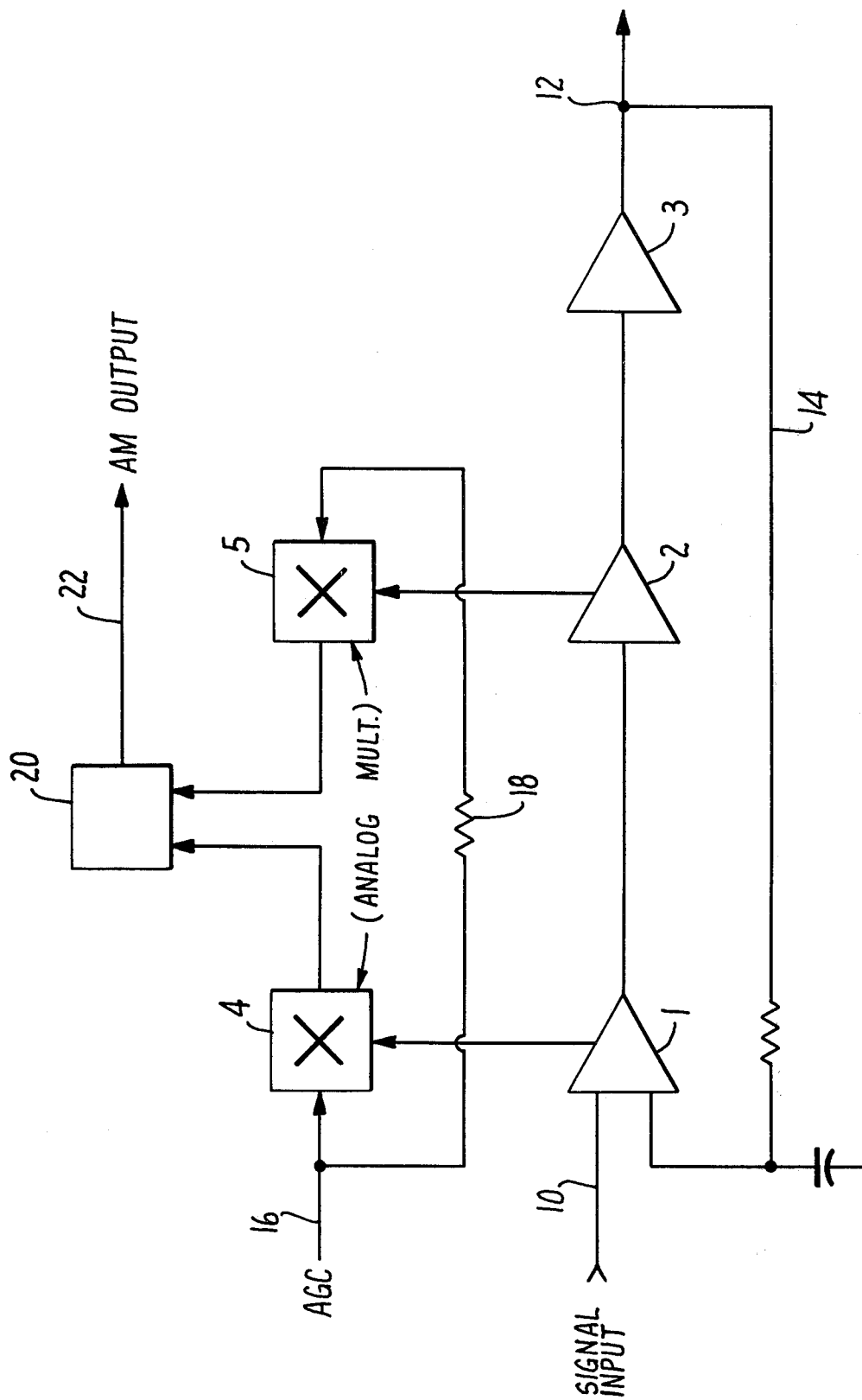
FIG. 1 is a simplified block diagram of an embodiment of the present invention.

Referring now to FIG. 1, the circuit basically consists of three amplifiers in cascade designated 1, 2 and 3. The signal is introduced through line 10 to the first amplifier and the FM output taken from the third amplifier through line 12. Inverse feedback is taken through line 14 to stabilize the amplifier.

The circuit includes two analog multiplier stages 4 and 5 and input to the multiplier 4 is taken from amplifier 1 and input to the multiplier 5 is taken from amplifier 2. AGC voltage from the AM detector is fed directly through line 16 to the multipliers 4 and 5. Outputs from the two analog multipliers are summed in circuit 20 and the AM output is taken through line 22. The multipliers 4 and 5 act as attenuators and the higher the AGC voltage the greater the attenuation. Reference voltages (not shown in the block diagram) are such that low AGC voltages cut in only attenuator 5 and as the AVC voltage increases, attenuator 4 is cut in.

Figure 2:
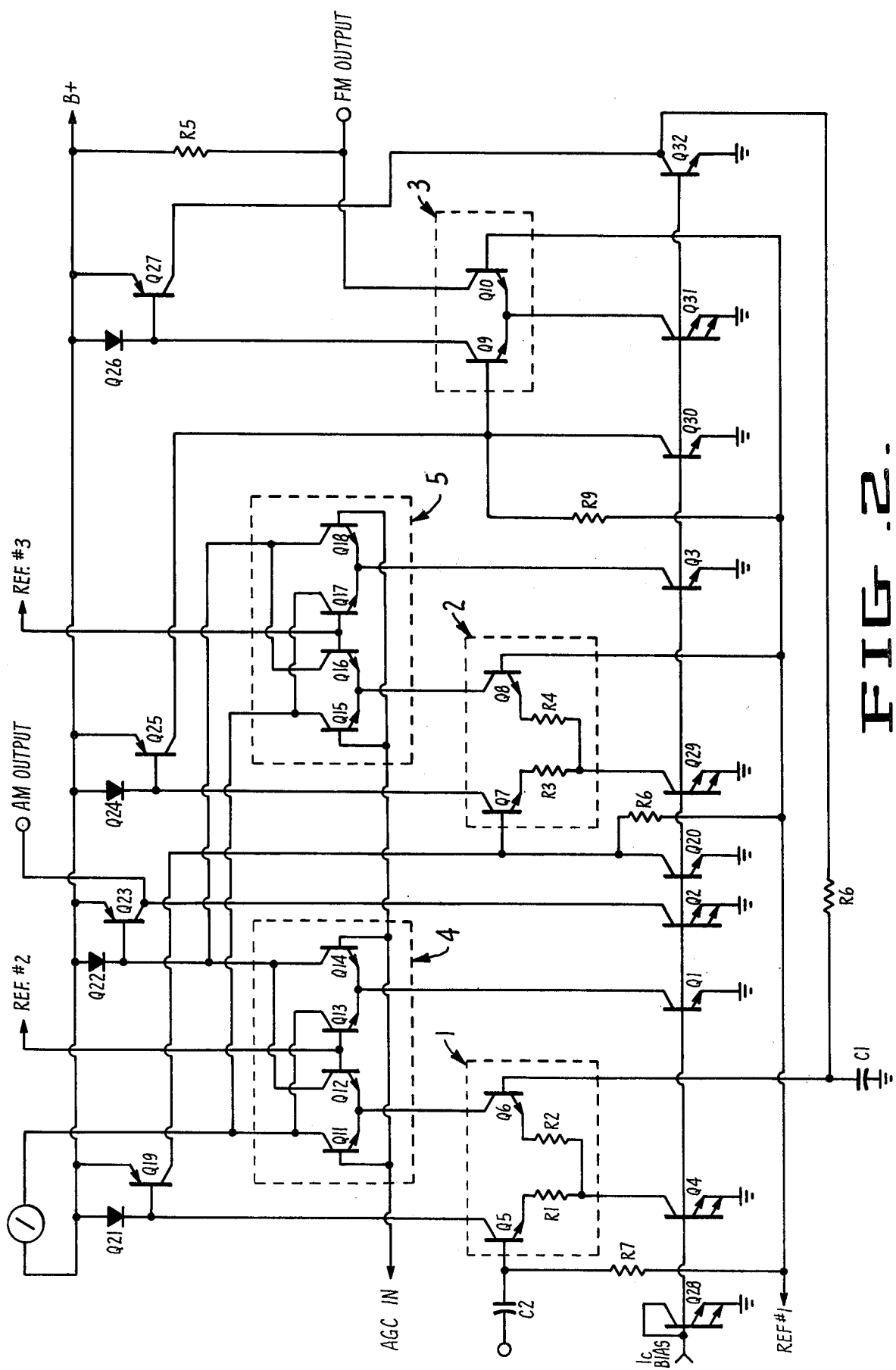
FIG. 2 is a schematic diagram of a practical embodiment of the invention.

Referring now to the detailed circuit diagram of FIG. 2, gain stage 1 is composed of a conventional transistor amplifier pair, Q5 and Q6. Similarly, gain stage 2 is composed of transistors Q7 and Q8, and gain stage 3 is composed of transistors Q9 and Q10.

Transistors Q11, Q12, Q13 and Q14 form one analog multiplier circuit generally designated 4. Transistors Q15, Q16, Q17 and Q18 form a second analog multiplier circuit generally designated 5. In this particular embodiment of the invention, both analog multiplier circuits 4 and 5 operate as voltage controlled attenuators. Both of these analog multiplier circuits vary the output signal current in inverse proportion to the AGC positive voltage, i.e. as the AGC voltage goes positive the signal current is attenuated. The control signal is an AGC voltage taken from the AM detector stage of the receiver in the usual manner. Analog multiplier reference voltages 2 and 3 are adjusted such that when a positive AGC voltage is applied, analog multiplier 5 exhibits at least 30 dB of attenuation before analog multiplier 4 begins to attenuate signals present at its input and as the AGC voltage goes up multiplier 4 has increased attenuation.

An intermediate frequency input signal is applied to gain stage 1 which is capable of about 30 dB amplification. One output of gain stage 1 goes to analog multiplier 4; the second output is reflected by a current mirror, consisting of transistors Q19 and Q21, to gain stage 2. Gain stage 2 provides an additional 30 dB amplification. One output of gain stage 2 goes to analog multiplier 5 while the other is reflected by a second current mirror consisting of transistors Q24 and Q25 to gain stage 3 for another 20 dB amplification. One output of gain stage 3 is the FM output of the network. The other output is reflected by a third current mirror, transistors Q26 and Q27, to provide negative feedback for gain stage 1. This feedback stabilizes the DC operating point of the overall amplifier network. Resistor R6 and capacitor C1 form a low pass network to reduce signal feedback to the amplifier input. In this configuration, the network provides about 80 dB of gain with good, hard limiting for the FM signal. Thus for an FM signal, the analog multipliers 4 and 5 do not take part in processing the signal.

The AM output of the network is obtained by summing the second output of gain stage 1 with the second output of gain stage 2. The input of Q22 is the output summation of the analog multipliers and the AM output is taken from the collector of Q23. Before summation, the output of gain stage 1 passes through analog multiplier circuit 4 and the output of gain stage 2 pass through analog multiplier circuit 5. In the absence of an AGC voltage applied to analog multiplier circuits 4 and 5, the output signals of gain stage 1 and gain stage 2 are simply combined to become the AM output of the entire network. However, when an AGC voltage is present, analog multiplier ciruits 4 and 5 act to attenuate the output signals from gain stages 1 and 2. Reference voltages 2 and 3 are adjusted such that in the presence of a small AGC voltage, only analog multiplier circuit 5 exhibits attenuation. As the AGC voltage increases, the attenuation of analog multiplier circuit 5 increases until this circuit exhibits 30 dB of attenuation. This amount of attenuation cancels the 30 dB amplification provided by gain stage 2. Only after analog multiplier 5 has reached 30 dB attenuation does a further increase in AGC voltage cause analog multiplier circuit 4 to attentuate the output signal from gain stage 1. Analog multiplier circuit 4 is also capable of 30 dB attenuation, and with maximum AGC voltage applied, effectively cancels the gain produced by gain stage 1. Operated in this manner, up to 60 dB of AM gain is possible from the network with 60 dB of automatic gain control range, i.e. the gain of the amplifier can go from unity to 60 dB.

Although certain gain and cut-off points have been set forth, it will be understood that these specific values are for illustration purposes only.

I claim:

1. An AM/FM intermediate frequency gain block comprising in combination:
   a. first, second, and third intermediate frequency amplifier stages in cascade;
   b. a source of an I.F. signal applied to the input of said first amplifier stage;
   c. the output of said third amplifier stage being the FM output of said intermediate frequency gain block;
   d. first and second analog multiplier stages, each of said stages being adapted to receive a signal and attenuate the same;
   e. said first amplifier having an output connected to the input of the first analog multiplier stage and said second amplifier having an output connected to the input of said second analog multiplier stage;
   f. said first and second analog multiplier stages having outputs connected to a summing circuit whereby the outputs of said two analog multiplier stages are summed, the output of said summing circuit being the AM output of said intermediate frequency gain block;
   g. separate sources of fixed bias for each of said first and second analog multiplier stages, said fixed biases normally maintaining said analog multiplier stages in a condition of unity attenuation;
   h. a source of an AGC voltage derived from an AM circuit, said AGC voltage being applied to said analog multiplier stages whereby an increase in said AGC voltage will overcome the fixed bias and thereby increase the attenuation of said analog multiplier stages, and
   i. said sources of fixed bias being selected whereby said AGC bias will first overcome the fixed bias of said second analog multiplier circuit, and as said AGC voltage increases, will then overcome the fixed bias applied to said first analog multiplier circuit.

2. The gain block of claim 1 wherein the amplification factor of the first amplifier stage is about equal to the attenuation factor of the first analog multiplier stage and the amplification factor of the second amplifier stage is about equal to the attenuation factor of the second analog multiplier stage.

3. The gain block of claim 2 wherein each factor is about 30 dB.

* * * * *